(12) United States Patent
Kuo et al.

(10) Patent No.: US 11,705,358 B2
(45) Date of Patent: Jul. 18, 2023

(54) SYSTEMS AND METHODS FOR AUTOMATED PROCESSING PORTS

(71) Applicant: Taiwan Semiconductor Manufacturing Co., Ltd., Hsin-Chu (TW)

(72) Inventors: Tsung-Sheng Kuo, Hsin-Chu (TW); Yi-Fam Shiu, Hsin-Chu (TW); Eason Chen, Hsin-Chu (TW); Yang-Ann Chu, Hsin-Chu (TW); Jiun-Rong Pai, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 795 days.

(21) Appl. No.: 16/588,182

(22) Filed: Sep. 30, 2019

(65) Prior Publication Data
US 2020/0161160 A1 May 21, 2020

Related U.S. Application Data

(60) Provisional application No. 62/751,872, filed on Oct. 29, 2018.

(51) Int. Cl.
| | |
|---|---|
| *H01L 21/67* | (2006.01) |
| *H01L 21/687* | (2006.01) |
| *H01L 21/677* | (2006.01) |
| *H01L 23/433* | (2006.01) |
| *H01L 21/60* | (2006.01) |

(52) U.S. Cl.
CPC .... *H01L 21/68707* (2013.01); *H01L 21/6773* (2013.01); *H01L 21/67294* (2013.01); *H01L 21/67706* (2013.01); *H01L 23/433* (2013.01); *H01L 2021/60105* (2013.01)

(58) Field of Classification Search
CPC .......... H01L 21/67; H01L 21/68; B65G 43/00
See application file for complete search history.

(56) References Cited

U.S. PATENT DOCUMENTS

| | | | | |
|---|---|---|---|---|
| 5,772,038 | A * | 6/1998 | Murata | H01R 43/205 220/23.4 |
| 5,870,820 | A * | 2/1999 | Arakawa | H01L 24/799 901/6 |
| 6,765,222 | B2 * | 7/2004 | Bacchi | H01L 27/1296 250/239 |
| 9,130,030 | B1 | 9/2015 | Park et al. | |
| 10,895,595 | B2 * | 1/2021 | Sanekata | H05K 3/0008 |
| 2007/0292256 | A1 * | 12/2007 | Fukazawa | H01L 21/67781 414/792.8 |

(Continued)

FOREIGN PATENT DOCUMENTS

| | | |
|---|---|---|
| CN | 101511713 A | 8/2009 |
| CN | 104011845 A | 8/2014 |
| TW | 20150255346 | 12/2015 |

*Primary Examiner* — Ronald P Jarrett
(74) *Attorney, Agent, or Firm* — Duane Morris LLP

(57) ABSTRACT

In an embodiment, a system includes: a tool port of a semiconductor processing tool; a processing port with an internal processing port location and an external processing port location; a robot configured to move a die vessel between the internal processing port location and the tool port; and an actuator configured to move the die vessel between the internal processing port location and the external processing port location.

20 Claims, 12 Drawing Sheets

(56) References Cited

U.S. PATENT DOCUMENTS

| | | | |
|---|---|---|---|
| 2012/0235793 A1* | 9/2012 | Yi | H01L 21/67294 |
| | | | 235/375 |
| 2013/0065189 A1* | 3/2013 | Yoshii | C23C 16/463 |
| | | | 432/9 |
| 2015/0187622 A1 | 7/2015 | Johnson | |
| 2015/0255346 A1 | 9/2015 | Park et al. | |
| 2016/0332301 A1* | 11/2016 | Kesil | B25J 11/0095 |
| 2019/0247900 A1* | 8/2019 | Park | B08B 9/0826 |

* cited by examiner

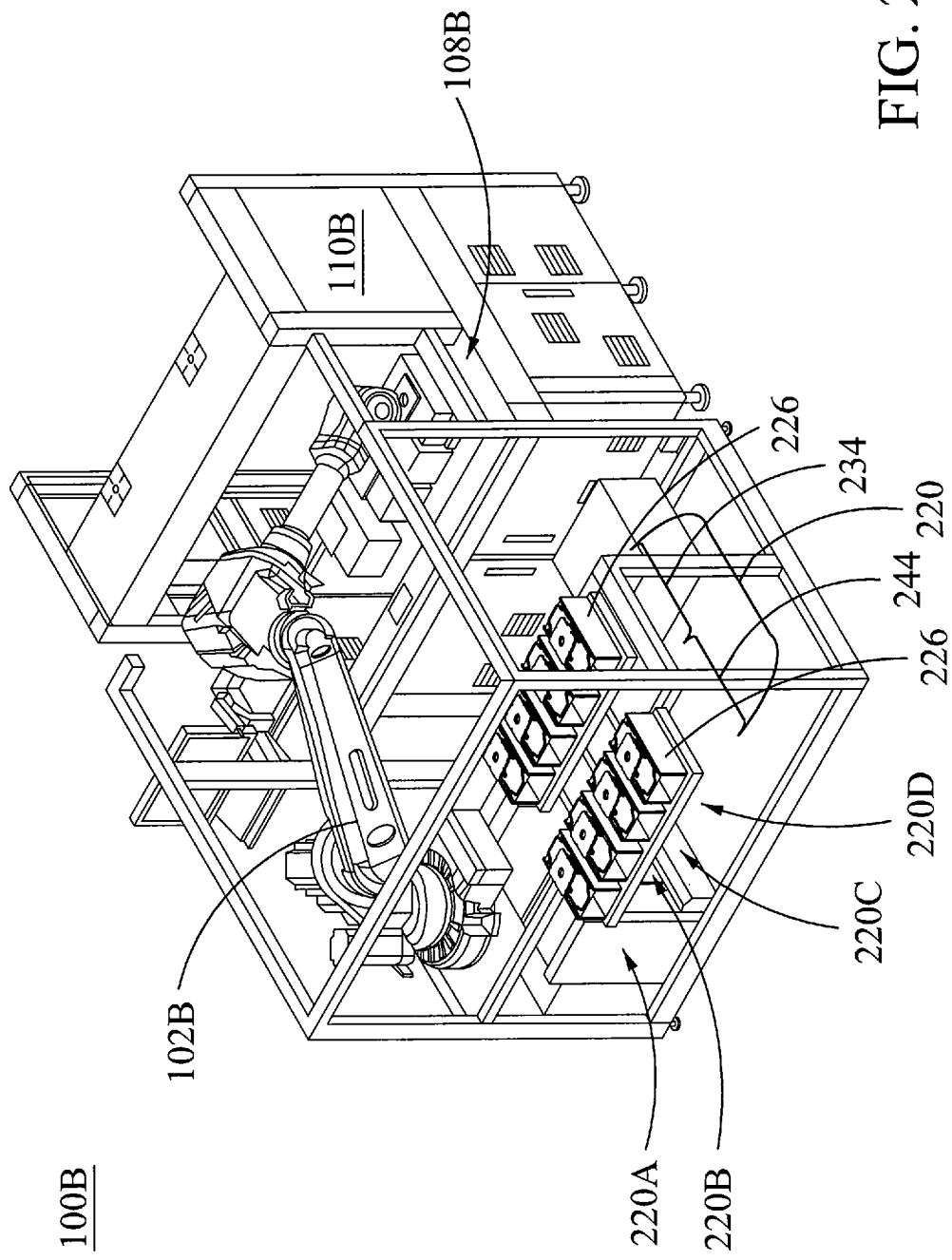

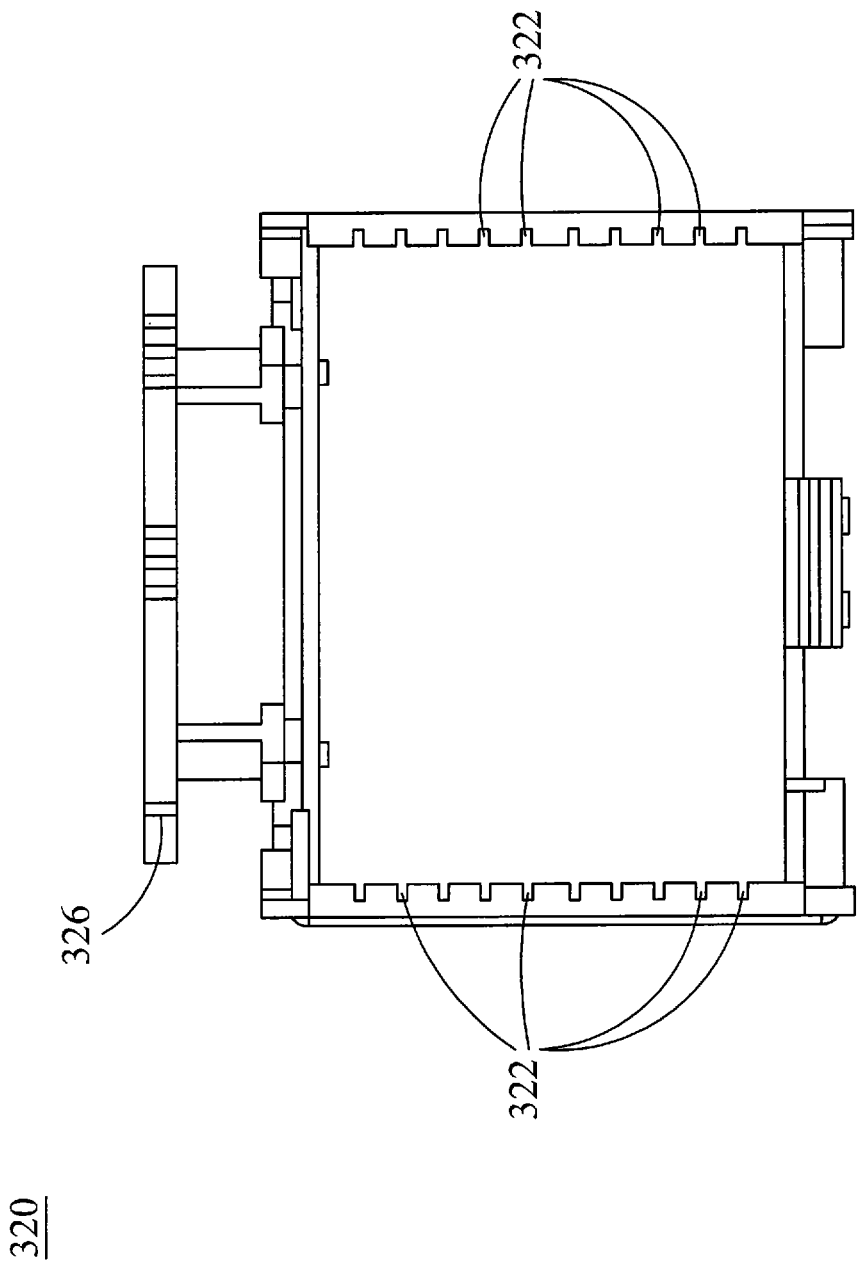

SYSTEMS AND METHODS FOR AUTOMATED PROCESSING PORTS

CROSS-REFERENCE TO RELATED APPLICATION

The present application claims priority to U.S. Provisional Patent Application No. 62/751,872, filed on Oct. 29, 2018, which is incorporated by reference herein in its entirety.

BACKGROUND

Modern manufacturing processes are typically highly automated to manipulate materials and devices and create a finished product. However, quality control and maintenance processes often rely on human skill, knowledge and expertise for inspection of the manufactured product both during manufacture and as a finished product.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 2C is a schematic diagram of the automated processing port system with a conveyor belt actuator system, in accordance with some embodiments.

FIG. 3C is a front view diagram of the slotted die vessel container, in accordance with various embodiments.

DETAILED DESCRIPTION OF EXEMPLARY EMBODIMENTS

Figure 1:
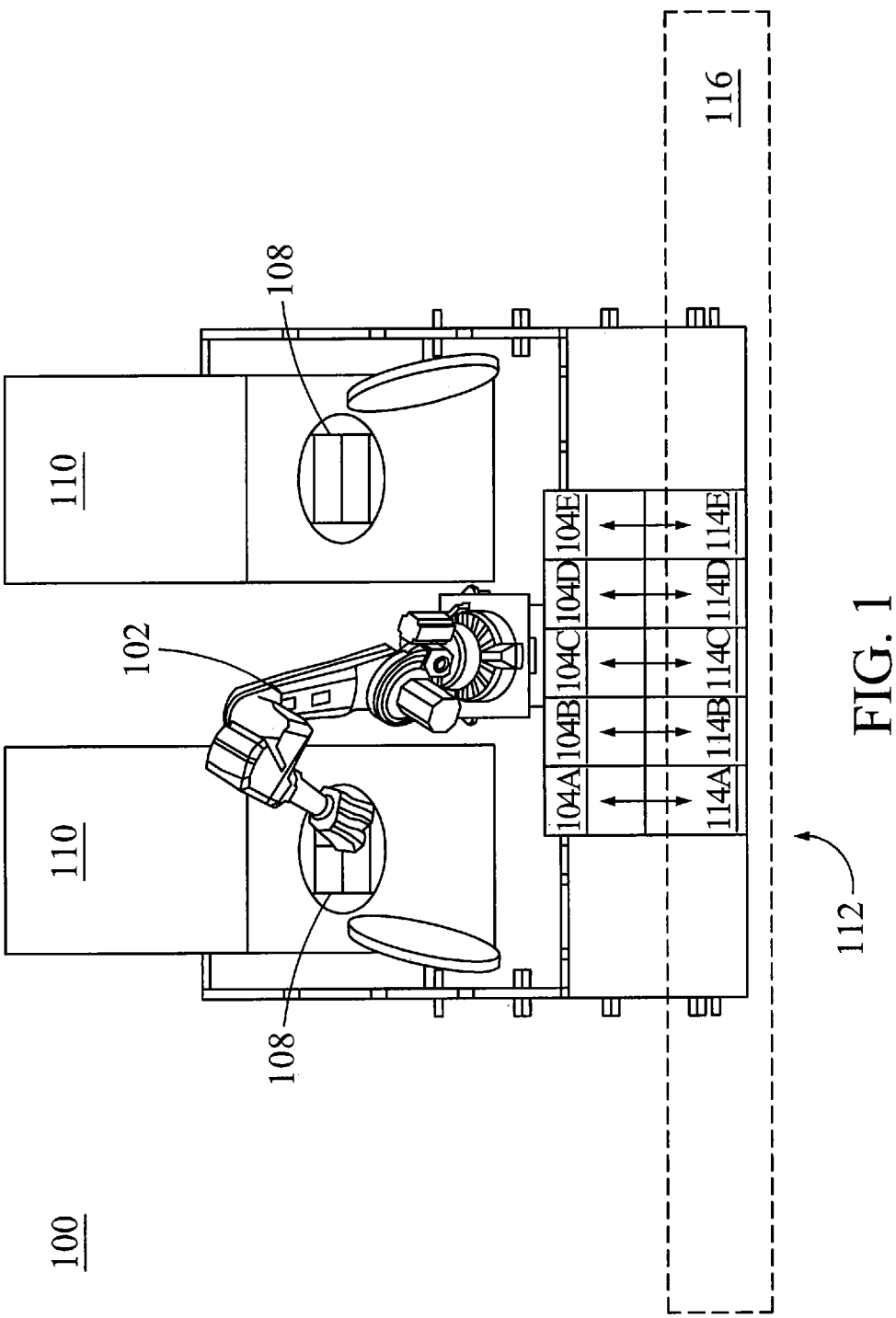
FIG. 1 is a schematic diagram of an automated processing port system, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods in accordance with various embodiments are directed to a processing port system. The processing port system may include a stationary robotic arm or a robot configured to move die vessels between a processing port and a tool port of a semiconductor processing tool. The die vessel may be any type of structure configured to hold one or more dies during transport to and from the semiconductor processing tool, which may process the one or more dies of the die vessel. These dies may be singulated pieces of a semiconductor wafer, or semiconductor workpiece. The tool port may be any type of interface or port for the semiconductor processing tool, such as a load port, an out port, or a combination of a load and/or out port for the semiconductor processing tool.

The processing port system may include an actuator system configured to move the die vessel container within a processing port. More specifically, the actuator system may be configured to move the die vessel container between an internal processing port location and an external processing port location of the processing port. The actuator system may be, for example, part of a push bar or a conveyor belt system. The internal processing port location may be within a work envelope of the robotic arm while the external processing port location may be outside of the work envelope of the robotic arm. Stated another way, the external processing port location may be a location on the processing port at a minimum distance away from the semiconductor processing tool and robotic arm for a human operator or an automated material handling system (AMHS) to safely put the die vessel container on the processing port without interference from the semiconductor processing tool (e.g., due to damage from proximity to a hot semiconductor processing tool) and/or robotic arm (e.g., due to damage from impact with a moving robotic arm). Advantageously, an operator or an AMHS may interface with the external processing port location without the possibility of damage or interference from the robotic arm.

The die vessel may be made of any type of material suitable for semiconductor die transport, such as a plastic or a metal. In certain embodiments, the die vessel may be referred to as a tray or a boat. Also, in particular embodiments, the die vessel may include a number of concave receptacles in which individual dies may be placed. These dies may be, optionally, further adhered in place in virtue of rotatable pin that may contact a top surface of a die while the die rests with a bottom surface on the die vessel.

The die vessel may be a discrete and removable part of a die vessel container. The die vessel container may be either a slotted die vessel container or a stackable die vessel container. The slotted die vessel container may include various slots from which die vessels may be inserted or removed. When within a slotted die vessel container, the die vessels may be located at a set predetermined distance from each other, as determined by the slots in the slotted die vessel container. In contrast, die vessels may be stacked with one on top of another in a stackable die vessel container. In certain embodiments, a die vessel container may be also referred to as a magazine or a tray cassette. Also, the die vessel container may be made of either a metal or a plastic. In particular embodiments, the slotted die vessel container may be made of a metal while the stackable die vessel container may be made of a plastic. In various embodiments, a die vessel container may be associated with information procurable from a radio frequency identification (RFID) tag that is adhered to a surface of the die vessel container. Such information may include, for example, an identifier for the constituent dies within the die vessel container.

The semiconductor processing tool may include any type of tool that may process the semiconductor die, such as a heating or non-heating tool. The heating tool may be configured to process dies by heating to between about 160 degrees centigrade to about 270 degrees centigrade.

In particular embodiments, sensor data may be collected by a sensor to character an actuator system for movement errors. For example, this sensor data may be force sensor data that characterizes an amount of force exerted by an actuator system to move dies (e.g., as part of a die vessel and/or die vessel container). This force sensor data may be collected by a force sensor, which may be any device that may measure an amount of force exerted on or from an object. For example, the force sensor may include a force gauge, a force sensing resistor, a force sensing capacitor, a spring compression sensor, and the like.

FIG. 1 is a schematic diagram of an automated processing port system 100, in accordance with some embodiments. The automated processing port system 100 may include a robotic arm 102 configured to move die vessels between various internal processing port locations 104A, 104B, 104C, 104D, 104E and the tool port 108 of one or more semiconductor processing tools 110.

The automated processing port system 100 may include a processing port 112 that includes the various internal processing port locations 104A, 104B, 104C, 104D, 104E and counterpart external processing port locations 114A, 114B, 114C, 114D, 114E. Die vessels may be moved between the internal processing port locations 104A, 104B, 104C, 104D, 104E and external processing port locations 114A, 114B, 114C, 114D, 114E using an actuator system. The actuator system may be, for example, part of a push bar or a conveyor belt system. For example, the actuator system may be part of a push bar system configured to move a die vessel container that includes die vessels by contacting a sidewall of the die vessel container with a lateral force. Alternatively, the actuator system may be a conveyor belt system configured to move die vessels that are part of a die vessel container. The conveyor belt system may move the die vessel container as it sits on a conveyor belt of the conveyor belt system.

Also, in certain embodiments an automated material handling system 116 (AMHS) may move die vessels to and from the external processing port locations 114A, 114B, 114C, 114D, 114E. The automated material handling system 116 may be, for example, a rail and vehicle system or a system that includes automatic guided vehicles (AGVs), personal guided vehicles (PGVs), rail guided vehicles (RGVs), overhead shuttles (OHSs), overhead hoist transports (OHTs), and the like.

The robotic arm 104 may be a programmable mechanical arm to grasp, hold, and manipulate objects such as a die vessel and/or a die vessel container. The robotic arm may be, for example, a six axis transfer robotic arm with six axes or degrees of freedom for movement. The robotic arm 104 may include a gripper hand. The gripper hand may be any type of end effector used for grasping or holding an object, such as a die vessel and/or a die vessel container, by the robotic arm 104. For example, the end effector may be a pressure gripper (e.g., gripping by applying pressure to an object, such as with a pincer type motion), an area gripper (e.g., gripping by surrounding an object to be manipulated), a vacuum gripper (e.g., gripping by suction force), a magnetic gripper (e.g., gripping by use of electromagnetic forces), and the like.

Figure 2A:
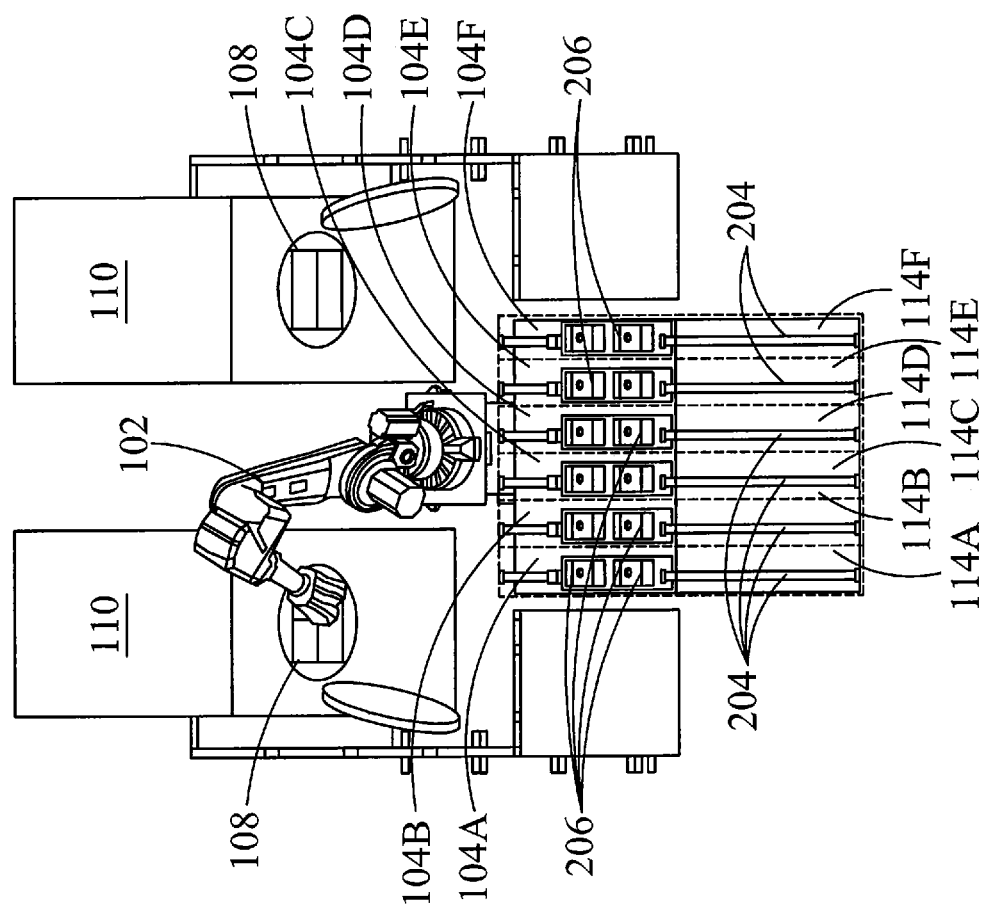
FIG. 2A is a schematic diagram of the automated processing port system with a push bar actuator system, in accordance with some embodiments.

FIG. 2A is a schematic diagram of the automated processing port system 100A with a push bar actuator system 202, in accordance with some embodiments. The push bar actuator system 202 may include various push bars 204 that may guide a die vessel container 206 between respective internal processing port locations 104A, 104B, 104C, 104D, 104E and counterpart external processing port locations 114A, 114B, 114C, 114D, 114E. In certain embodiments, the push bar may include discrete components that push against a sidewall of a respective die vessel container 206. In other embodiments, the push bar may be attached through the die vessel container 206 such that the die vessel container is transported along the length of the push bar, such as when the push bar includes a screw that may turn to move the die vessel container along the push bar.

Also, as illustrated, the automated processing port system 100A may include a robotic arm 102 configured to move die vessels between the various internal processing port locations 234A and the tool ports 108 of the semiconductor processing tool 110. In particular embodiments the tool port 108 may have multiple components, such as an out port (e.g., for outputting dies already processed by the semiconductor processing tool 110) or an in port (e.g., for receiving dies not yet processed by the semiconductor processing tool 110). In particular embodiments, the tool part may have multiple components that have a same function (e.g., as either an out port or an in port) or that have multiple functions (e.g., as both an out port and an in port).

In certain embodiments, the automated processing port system 100A of FIG. 2A may be configured to interface with a semiconductor processing tool 110 that performs a heat based operation to dies. For example, the semiconductor processing tool 110 may be configured to apply heat in the range of about 160 degrees Celsius to about 270 degrees Celsius in the course of processing dies. Accordingly, the die vessels that are brought to the semiconductor processing tool may be made of a relatively heat deformation resistant material such as metal (e.g., when compared with another material such as a plastic). Also, the die vessel containers 206 that include such die vessels may also be made of a relatively heat deformation resistant material such as metal (e.g., when compared with another material such as a plastic). In particular embodiments, the robotic arm 102 may additionally be configured to remove and/or insert die vessels to and from respective die vessel containers 206. The die vessels, separated from the die vessel containers by the robotic arm 102, may be moved between their respective die vessel container 206 and the tool port 108. As will be noted below, in particular embodiments, the die vessel container utilized in the automated processing port system 100A of FIG. 2A may be a slotted die vessel container. The slotted die vessel container may include various slots from which die vessels may be inserted or removed. When within a slotted die vessel container, the die vessels may be located at a set predetermined distance from each other, as determined by the slots in the slotted die vessel container.

In various embodiments, the slotted die vessel container may be associated with information procurable from a radio frequency identification (RFID) tag that is adhered to a surface of the slotted die vessel container. Such information may include, for example, an identifier for the constituent dies within the slotted die vessel container.

Figure 2B:
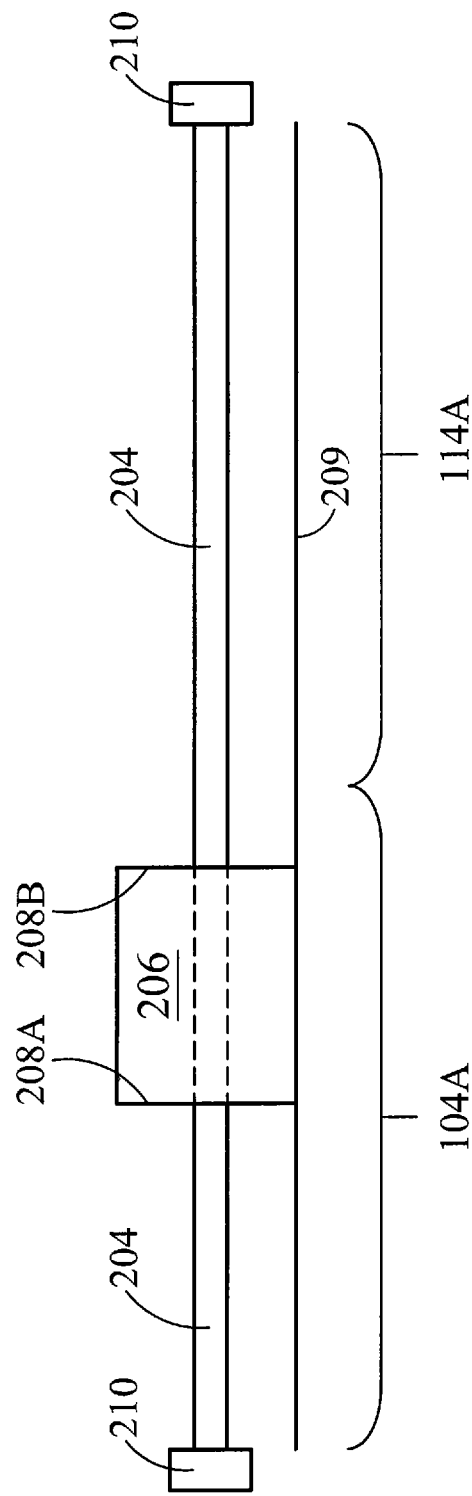
FIG. 2B is a side view diagram of the push bar actuator system, in accordance with some embodiments.

FIG. 2B is a side view diagram of the push bar actuator system 202, in accordance with some embodiments. The side view diagram illustrates how the push bar 204 may be in contact with respective front and rear sidewalls 208A, 208B of the die vessel container 206 the die vessel container sits on a surface 209 within the push bar actuator system. Accordingly, the push bar 204 may exert a pushing force against the front sidewall 208A in order to move the die vessel container 206 from the internal processing port location 104A to the external processing port location 114A. Also, the push bar 204 may exert a pushing force against the rear sidewall 208B in order to move the die vessel container 206 from the external processing port location 114A to the internal processing port location 104A. Also, the push bar 204 may extend beyond the internal processing port location 104A or the external processing port location 114A but is illustrated as within the internal processing port location 104A and the external processing port location 114A for ease of illustration. Optionally, in certain embodiments, the push bar may be attached through the die vessel container 206 such that the die vessel container is transported along the length of the push bar, such as when the push bar includes a screw that may turn to move the die vessel container along the push bar. In particular embodiments, the push bar may extend as necessary to apply a pushing force against either the first sidewall 208A or the second sidewall 201B. In other embodiments, the push bar may generally be in contact with the die vessel container 206 while the die vessel container is at the internal processing port location 104A or the external processing port location 114A.

In particular embodiments, the push bar 204 may interface with a force sensor 210 that may determine an amount of force exerted by the push bar 204 to move the die vessel container 206. As will be discussed further below, this amount of force may be compared against a force threshold to determine whether there is a movement error. In certain embodiments, this force threshold may include a single force threshold value. In other embodiments, this force threshold may include an upper threshold value and a lower threshold value. This movement error may be indicative of, for example, a die vessel container that is stuck, too heavy, too light, and/or a push bar 204 that is broken.

FIG. 2C is a schematic diagram of the automated processing port system 100B with a conveyor belt actuator system 220, in accordance with some embodiments. The conveyor belt actuator system 220 may include at least one conveyor belt 220A, 220B, 220C, 220D that may move a die vessel container 226 between respective internal processing port locations 234 and counterpart external processing port locations 244. Stated another way, the conveyor belt actuator system 220 may be configured to move the die vessel container 226 that sits on a conveyor belt of the conveyor belt system. More specifically, the conveyor belt system may move a conveyor belt on which the die vessel container 226 sits atop.

Also, as illustrated, the automated processing port system 100B may include a robotic arm 102B configured to move die vessels between the various internal processing port locations 234 and the tool port 108B of a semiconductor processing tool 110B.

In certain embodiments, the automated processing port system 100B of FIG. 2C may be configured to interface with a semiconductor processing tool 110B that performs a non-heat based operation to dies. Stated another way, the semiconductor processing tool 110B may not apply heat in the course of processing dies. Accordingly, the die vessels that are brought to the semiconductor processing tool may not be made of a relatively heat deformation resistant material such as metal (e.g., when compared with plastic). For example the die vessels that are brought to the semiconductor processing tool may be made of a less heat deformation resistant material such as a plastic. Also, the die vessel containers 226 that include such die vessels may also be made of a less heat deformation resistant material, such as plastic. In particular embodiments, the robotic arm 102 may additionally be configured to remove and/or insert die vessels to and from respective die vessel containers 226. The die vessels, separated from the die vessel containers 226 by the robotic arm 102, may be moved between a respective die vessel container 226 and the tool port 108. In particular embodiments, the die vessel container utilized in the automated processing port system 100B of FIG. 2C may be a stackable die vessel container. When within a stackable die vessel container, the die vessels may be located one on top of another and not separated by a predetermined distance, as noted above for a slotted die vessel container.

In other embodiments, the robotic arm 102B may be configured move dies (e.g., on die vessels) within respective die vessel containers 226 to and from the internal processing port location 234 and the tool port 108B. Stated another way, the robotic arm may not additionally be configured to remove and/or insert die vessels to and from respective die vessel containers 226.

In various embodiments, the stackable vessel container may be associated with information procurable from a radio frequency identification (RFID) tag that is adhered to a surface of the slotted die vessel container. Such information may include, for example, an identifier for the constituent dies within the slotted die vessel container.

Figure 2D:
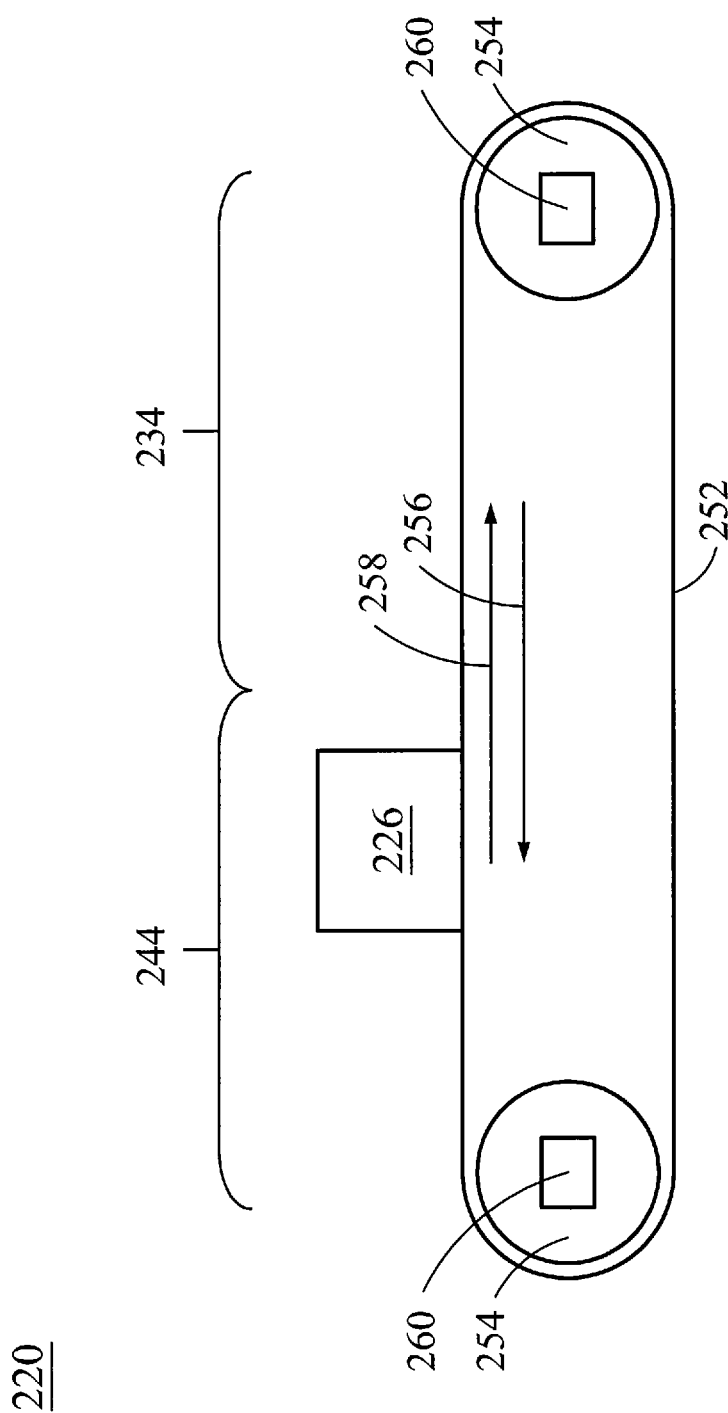
FIG. 2D is a side view diagram of the conveyor belt actuator system, in accordance with some embodiments.

FIG. 2D is a side view diagram of the conveyor belt actuator system 220, in accordance with some embodiments. The conveyor belt actuator system 220 may include a conveyor belt 252 that may be moved by rotating at least one of at least two pulleys 254. These pulleys 254 may be rotated in sync in order to cause the conveyor belt to also rotate around the pulleys 254. In certain embodiments, multiple pulleys and/or rollers may be arranged across (e.g., within) the conveyor belt in order to support the weight of an object on a top portion of the conveyor belt. Accordingly, the conveyor belt 252 (e.g., the top portion of the conveyor belt on which the die vessel container 206 sits) may move in a first direction 256 in order to move the die vessel container 206 from the internal processing port location 234 to the external processing port location 244. Also, the conveyor belt 252 (e.g., the top portion of the conveyor belt) may move in a second direction 258 in order to move the die vessel container 206 from the external processing port location 244 to the internal processing port location 234.

In particular embodiments, the conveyor belt actuator system 220 may interface with a force sensor 210 that may determine an amount of force exerted by the pulleys 254 to move the die vessel container 226. As will be discussed further below, this amount of force may be compared against a force threshold to determine whether there is a movement error. In certain embodiments, this force threshold may include a single force threshold value. In other embodiments, this force threshold may include an upper threshold value and a lower threshold value. This movement error may be indicative of, for example, a die vessel container that is stuck, too heavy, too light, and/or a pulley 254 that is broken.

Figure 3A:
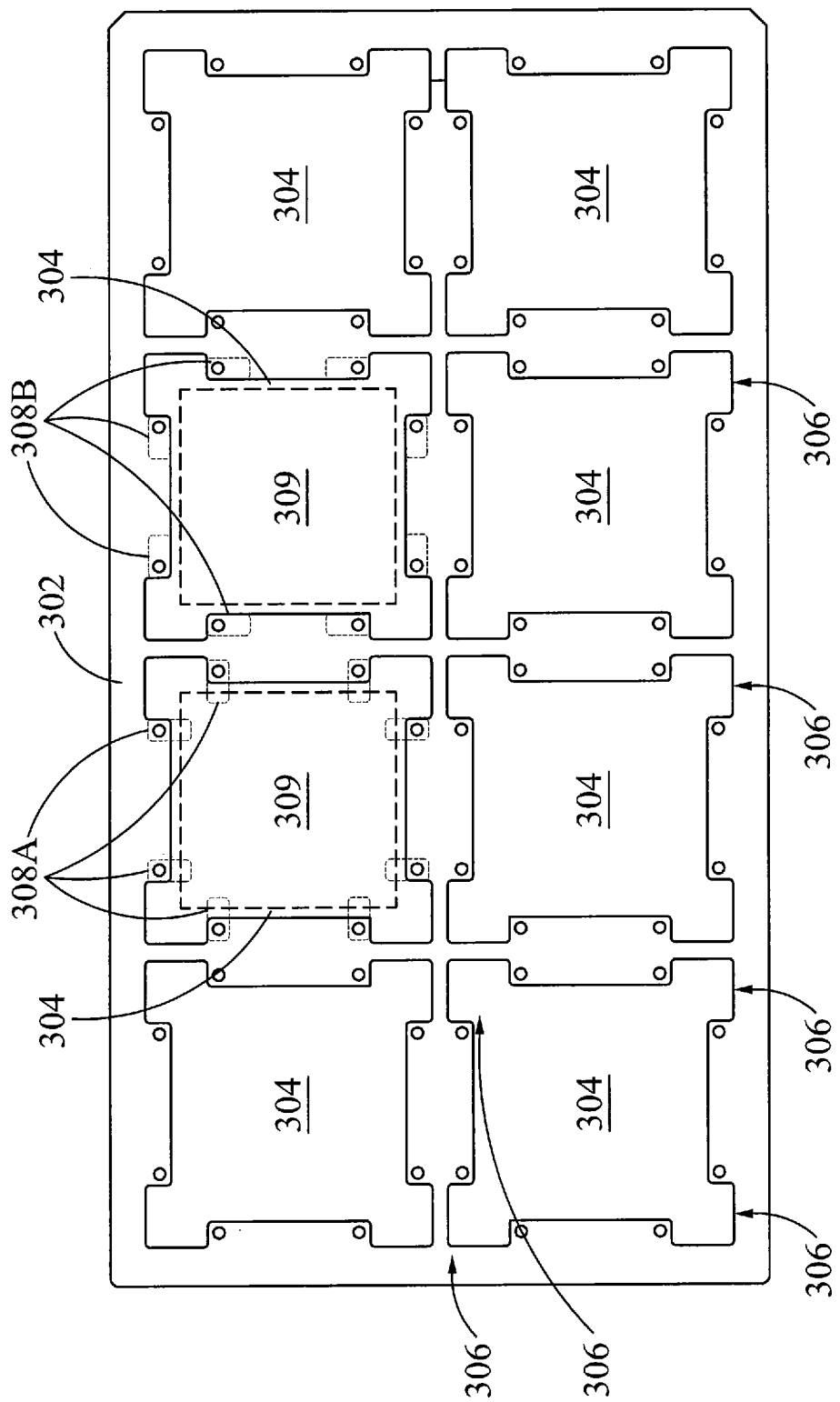
FIG. 3A is a schematic diagram of a die vessel, in accordance with various embodiments.

FIG. 3A is a schematic diagram of a die vessel 302, in accordance with various embodiments. The die vessel 302 may include a number of receptacles 304 in which to a die may be placed. For example, there may be eight receptacles 304, as illustrated in the embodiment of FIG. 3A. Each of the receptacles may be substantially rectangular in shape with a further protrusion along the square corner portions 306 of a respective receptacle 304. Optionally, each of the square corner portions 306 may be adjacent to pin holes in which a pin 308A, 308B may be disposed. The pins 308A, 308B may be configured (e.g., rotated) to be disposed over a die when the die is to be transported using the die vessel 302 and to be removed from over the die when the die is not to be transported using the die vessel. For example, pins 308A (drawn in phantom) illustrate how the pins 308A is disposed over a die 309 (drawn in phantom) when the die is to be transported using the die vessel 302. Also, pins 308B (drawn in phantom) illustrate how the pins 308B are not disposed over a die 309 when the die 309 is not to be transported using the die vessel 302 (e.g., to be removed from the die vessel).

Figure 3B:
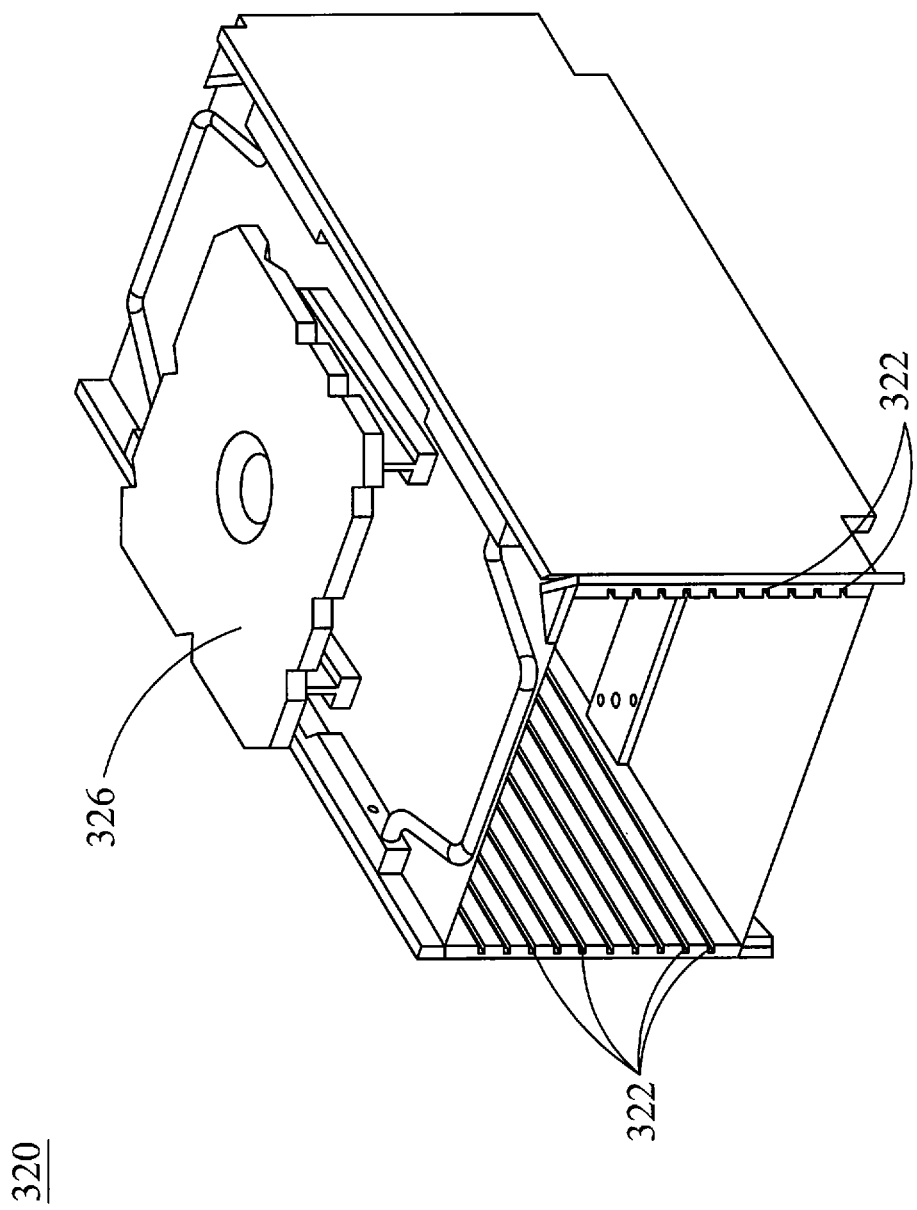
FIG. 3B is a perspective view diagram of a slotted die vessel container, in accordance with various embodiments.

FIG. 3B is a perspective view diagram of a slotted die vessel container 320, in accordance with various embodiments. The slotted die vessel container 320 may include slots 322. The slots 322 may be concavities from which die vessels may be secured and/or guided along during insertion or removal. When within a slotted die vessel container 320, the die vessels may be located at a set predetermined vertical distance from each other, as determined by the slots 322 in the slotted die vessel container 320. In particular embodiments, the slotted die vessel container 320 may include a handle 326, using which a robotic arm may be configured to secure and move the slotted die vessel container 320.

FIG. 3C is a front view diagram of the slotted die vessel container 320, in accordance with various embodiments. As illustrated, the slots 322 may be concavities from which die vessels may be secured and/or guided along during insertion or removal. The handle 326 may be a protrusion using which a robotic arm may be configured to secure and manipulate the slotted die vessel container 320.

Figure 3D:
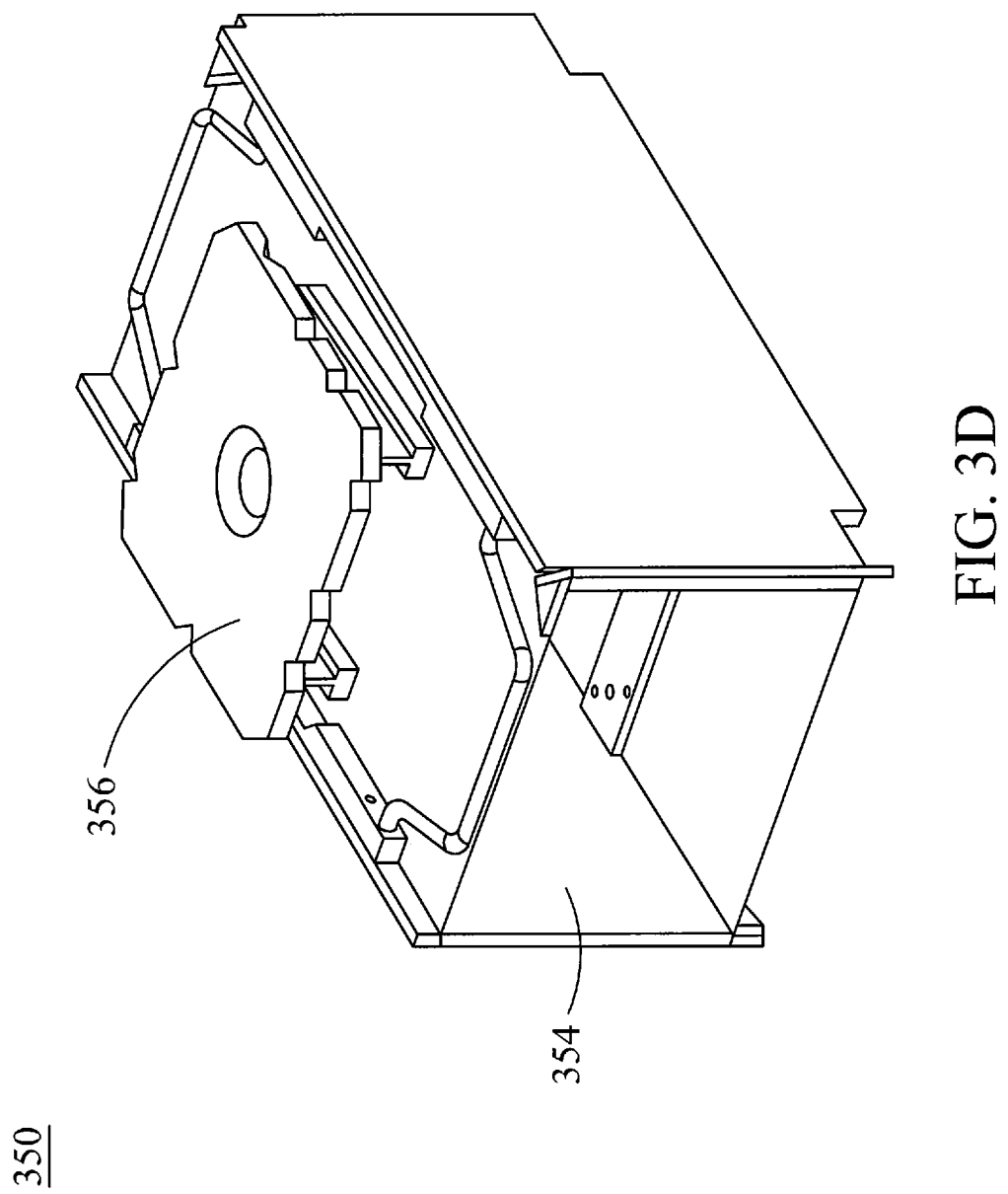
FIG. 3D is a perspective view diagram of a stackable die vessel container, in accordance with various embodiments.

FIG. 3D is a perspective view diagram of a stackable die vessel container 350, in accordance with various embodiments. The stackable die vessel container 350 may be configured to store die vessels stacked one on the other. For example, the stackable die vessel container 350 may include smooth internal walls 354 without specific concavities such as slots in which die vessels may be disposed and/or guided along. In particular embodiments, the stackable die vessel container 350 may include a handle 356, using which a robotic arm may be configured to secure and move the stackable die vessel container 350.

Figure 3E:
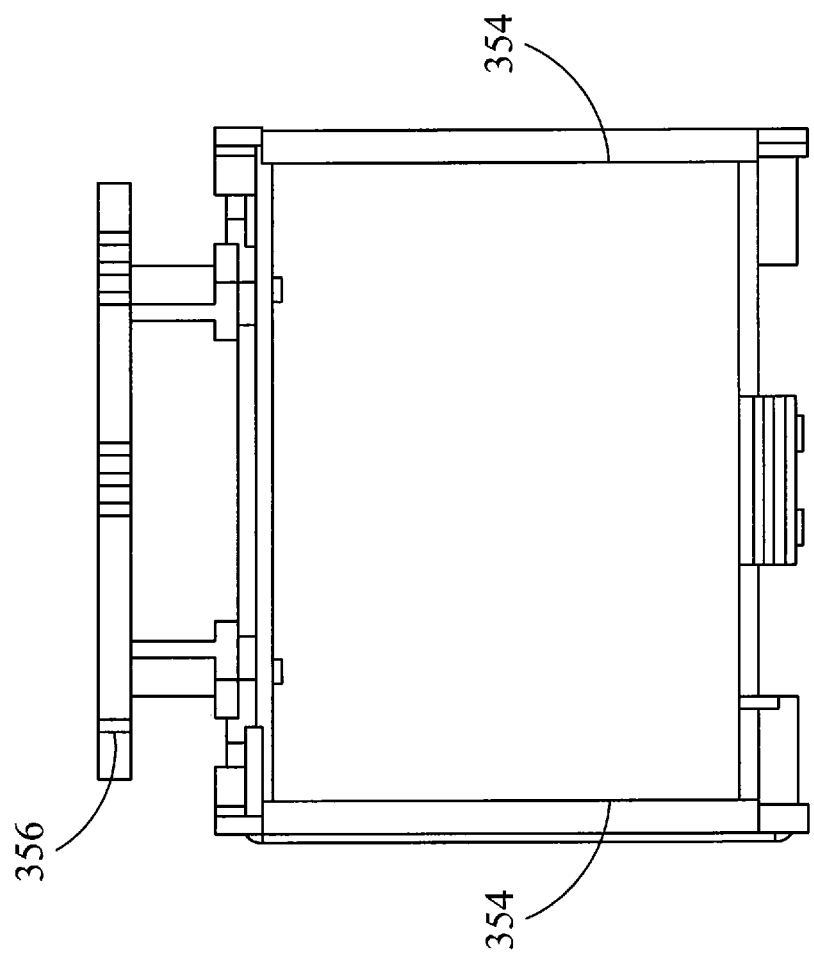
FIG. 3E is a front view diagram of the stackable die vessel container, in accordance with various embodiments.

FIG. 3E is a front view diagram of the stackable die vessel container 350, in accordance with various embodiments. As illustrated, internal walls 354 of the stackable die vessel container 350 may be substantially smooth and without specific concavities such as slots in which die vessels may be disposed. Also, the handle 356 may protrude from the stackable die vessel container 350.

Figure 4:
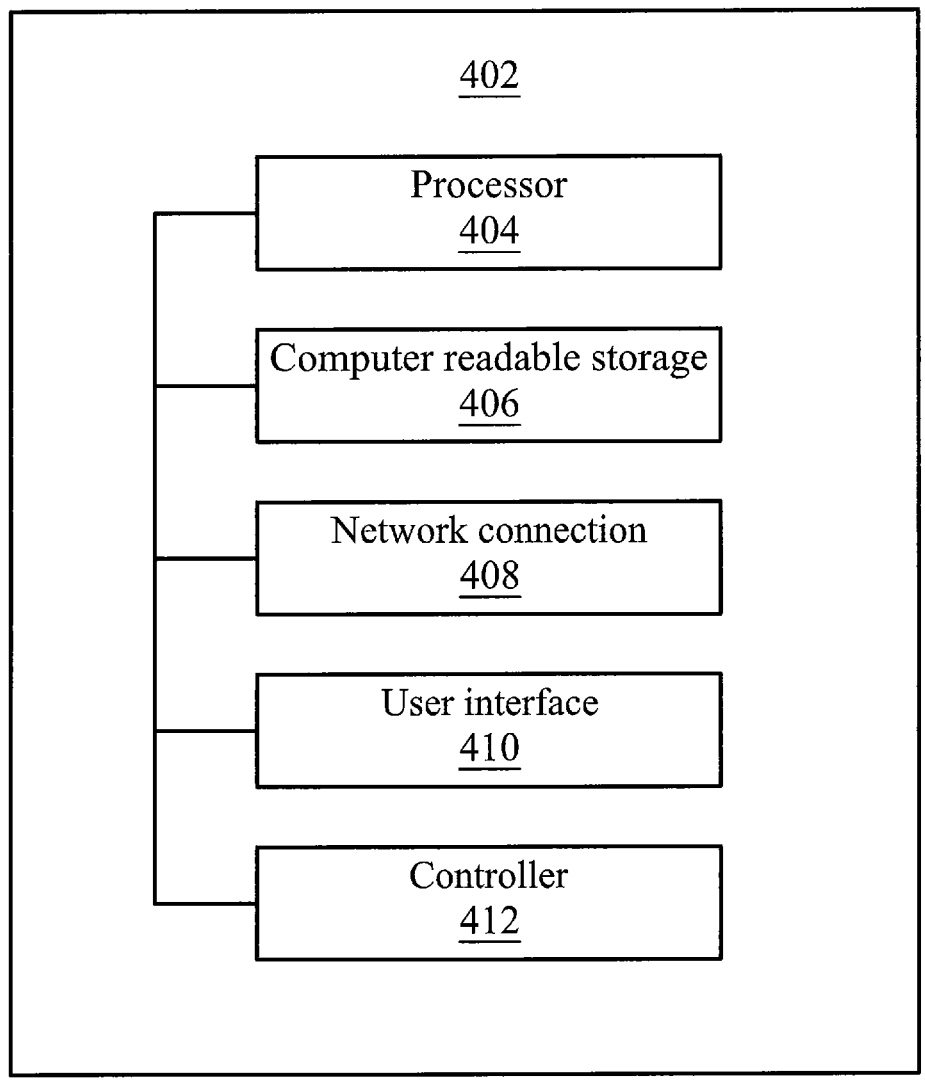
FIG. 4 is a block diagram of various functional modules of a processing port system functional module, in accordance with some embodiment.

FIG. 4 is a block diagram of various functional modules of a processing port system functional module 402, in accordance with some embodiment. The processing port system functional module 402 may be part of a processing port system that includes at least one robotic arm with an actuator system. The processing port system functional module 402 may include a processor 404. In further embodiments, the processor 404 may be implemented as one or more processors.

The processor 404 may be operatively connected to a computer readable storage module 406 (e.g., a memory and/or data store), a network connection module 408, a user interface module 410, a controller module 412, and a sensor module 414. In some embodiments, the computer readable storage module 406 may include processing port process logic that may configure the processor 404 to perform the various processes discussed herein. The computer readable storage may also store data, such as sensor data collected by one or more force sensors, data for identifying a movement error, thresholds that include one or more threshold values, identifiers for a die, identifiers for a die vessel, identifiers for a die vessel container, identifiers for a sensor, and any other parameter or information that may be utilized to perform the various processes discussed herein.

The network connection module 408 may facilitate a network connection of the processing port system with various devices and/or components of the workstation that may communicate within or external to the processing port system functional module 402. In certain embodiments, the network connection module 408 may facilitate a physical connection, such as a line or a bus. In other embodiments, the network connection module 408 may facilitate a wireless connection, such as over a wireless local area network (WLAN) by using a transmitter, receiver, and/or transceiver. For example, the network connection module 408 may facilitate a wireless or wired connection with various gripper hand sensors, the processor 404 and the controller module 412.

The processing port system functional module 402 may also include the user interface module 410. The user interface module 410 may include any type of interface for input and/or output to an operator of the processing port system, including, but not limited to, a monitor, a laptop computer, a tablet, or a mobile device, etc.

The processing port system functional module 402 may include a controller module 412. In certain embodiments, the controller module 412 may be implemented by (e.g., be part of) the processor 404. The controller module 412 may be configured to control various physical apparatuses that control movement or functionality of the processing port system, at least one robotic arm, and/or the actuator system. For example, the controller module 412 may be configured to control movement or functionality for at least one of a pulley, a push bar, a robotic arm, and the like. For example, the controller module 412 may control a motor that may move at least one of a pulley, a push bar, and a robotic arm. The controller may be controlled by the processor and may carry out the various aspects of the various processes discussed herein.

Figure 5:
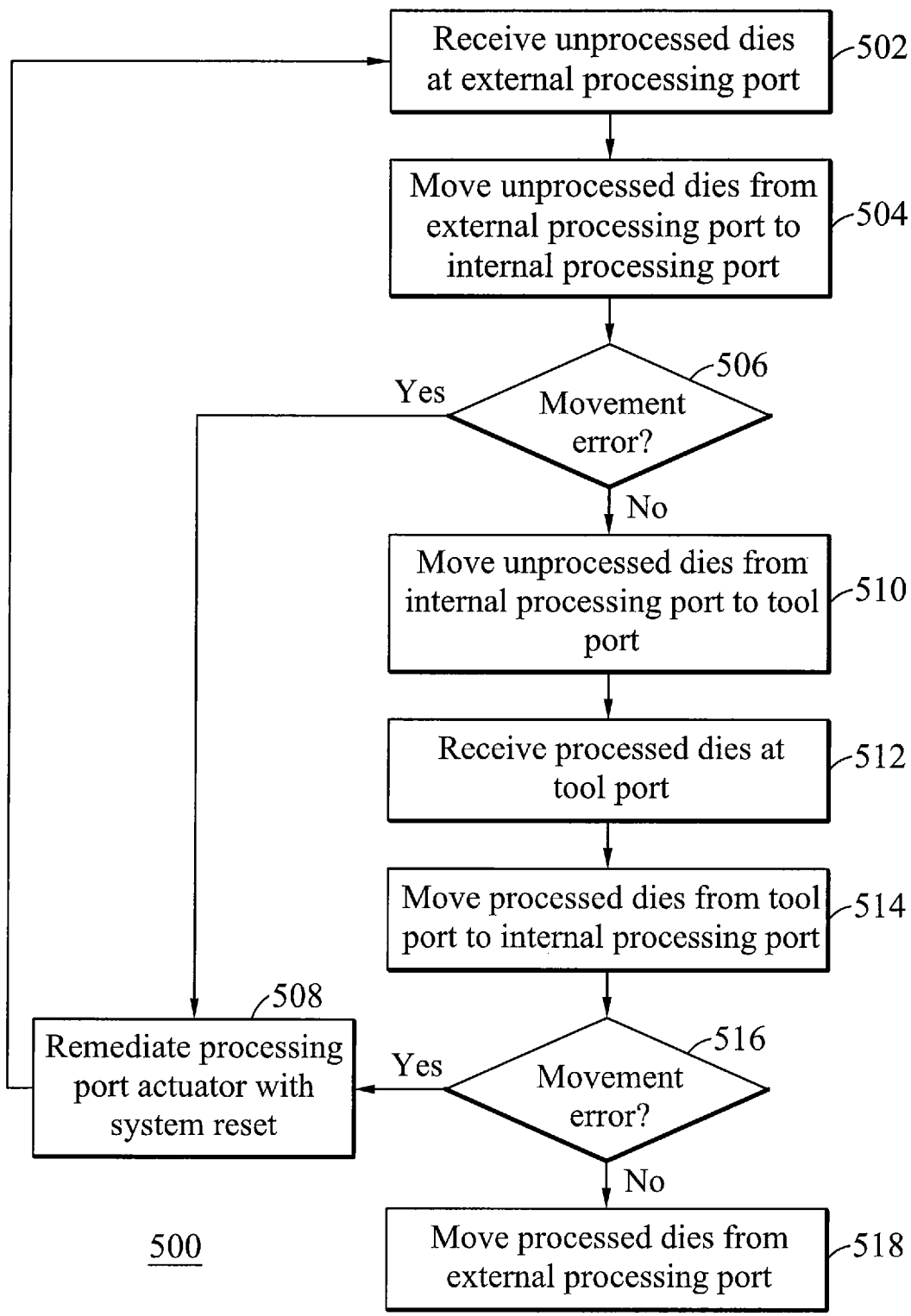
FIG. 5 is a flowchart of a processing port process, in accordance with some embodiments.

FIG. 5 is a flowchart of a processing port process, in accordance with some embodiments. The processing port process may be performed by a processing port system, as introduced above. It is noted that the process 500 is merely an example, and is not intended to limit the present disclosure. Accordingly, it is understood that additional operations may be provided before, during, and after the process 500 of FIG. 5, certain operations may be omitted, certain operations may be performed concurrently with other operations, and that some other operations may only be briefly described herein.

At operation 502, unprocessed dies may be received at an external processing port location. As noted above, these unprocessed dies may be collected on a die vessel. The die vessel may include multiple receptacles configured to receive each die on the die vessel. The receptacles may be flanked by at least one pin, which may be moved over the die to secure the die to the die vessel. Optionally, a die vessel may not include a pin in certain embodiments. In particular embodiments, the die vessel may be made from various materials that have different degrees of malleability from heat application, such as a metal or a plastic.

In particular embodiments, the unprocessed dies, as part of a die vessel, may be received by being placed on the external processing port location by an automated material handling system. The automated material handling system may be, for example, a rail and vehicle system or a system that includes automatic guided vehicles (AGVs), personal guided vehicles (PGVs), rail guided vehicles (RGVs), overhead shuttles (OHSs), and overhead hoist transports (OHTs). The unprocessed dies may be transferred to the external processing port location via a manipulation of the automated material handling system (e.g., movement via an automated material handling system robotic arm). In other embodiments, the unprocessed dies may be placed manually on the external processing port location by an operator or technician of the processing port system.

Furthermore, the die vessels may be located within a die vessel container. As noted above, the die vessel may be a discrete and/or removable part of a die vessel container. The die vessel container may be either a slotted die vessel container or a stackable die vessel container. The slotted die vessel container may include various slots from which die vessels may be secured, inserted, or removed. When within a slotted die vessel container, the die vessels may be located at a set predetermined vertical distance from each other, as determined by the slots in the slotted die vessel container. In contrast, die vessels may be stacked with one on top of another in a stackable die vessel container. In certain embodiments, a die vessel container may be also referred to as a magazine or a tray cassette. Also, the die vessel container may be made of either a metal or a plastic. In particular embodiments, the slotted die vessel container may be made of a metal while the stackable die vessel container may be made of a plastic. In various embodiments, a die vessel container may be associated with information procurable from a radio frequency identification (RFID) tag that is adhered to a surface of the die vessel container. Such information may include, for example, an identifier for the constituent dies within the die vessel container.

At operation 504, the unprocessed dies may be moved from the external processing port location to an internal processing port location. The movement may be performed by an actuator system.

In certain embodiments, the actuator system may be a push bar actuator system. The push bar actuator system may include at least one push bar configured to contact a sidewall of a die vessel container in order to move the die vessel container. For example, the push bar may exert a pushing force against a rear sidewall in order to move the die vessel container from an external processing port location to an internal processing port location. Or, the push bar may exert a pushing force against a front sidewall in order to move the die vessel container from the internal processing port location to the external processing port location. Optionally, in certain embodiments, the push bar may pass through the die vessel container such that the die vessel container is transported along the length of the push bar. For example, the push bar and die vessel container may form a screw that may turn to move the die vessel container along the push bar.

In various embodiments, the actuator system may be a conveyor belt actuator system. The conveyor belt actuator system may include a conveyor belt moved by rotating at least one of at least two pulleys at either end of the conveyor belt. These pulleys may be rotated in sync in order to cause the conveyor belt to also rotate around the pulleys. In certain embodiments, multiple pulleys and/or rollers may be arranged across the conveyor belt in order to support the weight of an object on a top portion of the conveyor belt. Accordingly, the conveyor belt (e.g., the top portion of the conveyor belt on which a die vessel container sits) may move in a particular direction in order to move the die vessel container from the external processing port location to the internal processing port location.

In particular embodiments, the actuator system may interface with at least one force sensor configured to determine an amount of force applied by the actuator system to move the unprocessed dies. For example, the conveyor belt actuator system may interface with a force sensor that may determine an amount of force exerted by at least one pulley to move the die vessel container that includes the unprocessed dies. Also, the push bar actuator system may interface with a force sensor that may determine an amount of force exerted by the push bar to move the die vessel container. This amount of force may be compared against a force threshold to determine whether there is a movement error. In certain embodiments, this force threshold may include a single force threshold value. In other embodiments, this force threshold may include an upper threshold value and a lower threshold value. This movement error may be indicative of, for example, a die vessel container that is stuck, too heavy, too light, and/or a pulley or push bar that is broken.

At operation 506, a decision may be made as to whether a movement error has occurred. The movement error may represent when a sensed force value associated with the actuator system, as sensed from a force sensor, passes a particular force threshold. As noted above, this force threshold may include an upper threshold value and/or a lower threshold value. For example, when the sensed force value passes either the upper force threshold value and/or the lower force threshold value, a movement error may be triggered. The process 500 may proceed to operation 508 when a movement error is triggered. Alternatively, the process 500 may proceed to operation 510 when no movement error is triggered during movement between the external processing port location and internal processing port location.

At operation 508, the actuator system that triggered the movement error may be corrected and the processing port system reset. More specifically, the actuator system and/or wider processing port system may be inspected manually to determine the source of the movement error. For example, an inspection may be made to determine whether the die vessel container is stuck, too heavy, too light, and/or if a pulley or push bar of the actuator system is broken. Then, the movement error may be corrected once the source of the movement error is determined. For example, in response to the movement error, movement at the actuator system may be ceased, the die vessel may be moved from the internal processing port to the tool port using the robotic arm, the die vessel may be removed from the actuator, and/or the die vessel may be removed from a die vessel container while on the internal processing port. In this manner, a die vessel container may be removed and/or a pulley or push bar of the actuator system repaired and/or replaced. Then, once the movement error is corrected, the processing port system may be reset to receive unprocessed dies at the external processing port location again (e.g., the process 500 may proceed to operation 502).

At operation 510, the unprocessed dies may be moved from the internal processing port location to a tool port. As noted above, the internal processing port location may be within a work envelope of a robotic arm while the external processing port location may be outside of the work envelope of the robotic arm. Thus, the external processing port location may be a position on the load port at a minimum sufficient distance away from the semiconductor processing tool and robotic arm for a human operator or an automated material handling system to safely put the die vessel container on the load port without interference from the semiconductor processing tool and/or robotic arm.

In particular optional embodiments, the robotic arm may additionally be configured to remove and/or insert die vessels to and from respective die vessel containers. The die vessels, separated from the die vessel containers by the robotic arm, may be moved between a respective die vessel container and the tool port. Stated another way, the robotic arm may be configured move dies on die vessels to and from the internal processing port location and the tool port.

Then, once the unprocessed dies are at the tool port, a semiconductor processing tool associated with the tool part may intake the unprocessed dies and process the unprocessed dies to produce processed dies. The semiconductor processing tool may include any type of tool that may process the semiconductor die, such as a heating or non-heating tool. For example, the heating tool may be configured to process dies by heating to between about 160 degrees centigrade to about 270 degrees centigrade.

At operation 512, the processed dies may be received at the tool port. These processed dies may be part of a die vessel without a die vessel container or part of a die vessel that is already within a die vessel container. Accordingly, when the processed dies are part of a die vessel without a die vessel container, the robotic arm may be configured to insert the die vessels into a respective die vessel container at the internal processing port location. In certain embodiments, the respective die vessel container is the same die vessel container that the processed dies, when unprocessed, were taken out of. In other embodiments, the respective die vessel container may be a die vessel container that is associated with the processed dies, such as a die vessel container that is associated or allocated to the processed dies in a predetermined manner (e.g., based on time of transfer to the die vessel container or based on type or processing).

In other embodiments, the tool port may provide the processed dies as part of a die vessel container. Accordingly, the robotic arm may move the die vessel container from the tool port to the internal processing port location.

At operation 514, the processed dies may be moved from the tool port to the internal processing port location. As noted above, this movement may be performed by an actuator system that may be, for example, a push bar actuator system. For example, the push bar of the push bar actuator system may exert a pushing force against a sidewall of the die vessel container in order to move the die vessel container from the internal processing port location to the external processing port location. Optionally, in certain embodiments, the push bar may be attached through the die vessel container such that the die vessel container is transported along the length of the push bar. For example, such a push bar may be formed as a screw that may turn to move the die vessel container along the push bar.

In various embodiments, the actuator system may be a conveyor belt actuator system. The top portion of a conveyor belt of the conveyor belt system (e.g., on which a die vessel container sits) may move the die vessel container from the internal processing port location to the external processing port location.

As noted above, the actuator system may interface with at least one force sensor configured to determine an amount of force applied by the actuator system to move the unprocessed dies. This amount of force may be compared against a force threshold to determine whether there is a movement error.

At operation 516, a decision may be made as to whether a movement error has occurred. As noted above, the movement error may represent when a sensed force value associated with the actuator system, as sensed from a force sensor, passes a particular force threshold. This force threshold may include an upper threshold value and/or a lower threshold value. For example, when the sensed force value passes either the upper force threshold value and/or the lower force threshold value, a movement error may be triggered. The process 500 may proceed to operation 508 when a movement error is triggered. Alternatively, the process 500 may proceed to operation 518 when no movement error is triggered during movement between the external processing port location and internal processing port location.

At operation 518, the processed dies may be moved from the external processing port location. In certain embodiments, the processed dies, as part of a die vessel container, may be moved by an automated material handling system. The unprocessed dies may be transferred from the external processing port location via a manipulation of the automated material handling system (e.g., movement via an automated material handling system robotic arm). In other embodiments, the unprocessed dies may be removed manually from the external processing port location by an operator or technician of the processing port system.

In an embodiment, a system includes: a tool port of a semiconductor processing tool; a processing port with an internal processing port location and an external processing port location; a robot configured to move a die vessel between the internal processing port location and the tool port; and an actuator configured to move the die vessel between the internal processing port location and the external processing port location.

In another embodiment, a system includes: a tool port of a semiconductor processing tool; a processing port with an internal processing port location and an external processing port location; a robot configured to move a die vessel between the internal processing port location and the tool port; an actuator configured to move the die vessel between the internal processing port location and the external processing port location; and a sensor configured to sense an amount of force exerted by the actuator in motion.

In another embodiment, a method includes: moving a die vessel between an external processing port and an internal processing port using an actuator, wherein the die vessel is configured to be moved from the internal processing port to a tool port using a robot; determining a force value exerted by the actuator in response to moving the die vessel; and ceasing movement of the die vessel in response to the force value passing a threshold value.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
    a die vessel;
    a processing port with an internal processing port location and an external processing port location;
    an actuator configured to move the die vessel between the internal processing port location and the external processing port location, wherein the die vessel comprises a plurality of receptacles, each of the plurality of receptacles configured to hold an unfinished die therein, and wherein when the die vessel is located at the internal processing port location; and
    a robot configured to move each of the unfinished dies from a respective receptacle to a port of a semiconductor processing tool,
    wherein the actuator comprises:
        a conveyor belt configured to move the die vessel container between the internal procession port location and the external processing port location;
        a plurality of pulleys configured to rotate and cause movement of the conveyor belt; and
        a force sensor coupled to at least one of the pulleys and configured to determine an amount of force exerted by the at least one of the pulleys to move the die vessel container.

2. The system of claim 1, wherein the external processing port location is beyond a work envelope of the robot.

3. The system of claim 1, wherein the robot includes a work envelope that spans a tool port to the internal processing port location.

4. The system of claim 1, wherein the actuator is configured to move the die vessel as part of a die vessel container that includes multiple die vessels.

5. The system of claim 1, wherein
    the force sensor comprises at least one of: a force gauge, a force sensing resistor, a force sensing capacitor, or a spring compression sensor.

6. The system of claim 1, wherein the die vessel comprises a metal.

7. The system of claim 1, wherein the robot comprises a six axis transfer robotic arm having six degrees of freedom for movement.

8. The system of claim 7, wherein the die vessel comprises a plastic.

9. A system, comprising:
- a processing port with an internal processing port location and an external processing port location;
- a robot configured to move a die vessel between the internal processing port location and a port of a semiconductor processing tool; and
- an actuator configured to move the die vessel between the internal processing port location and the external processing port location, wherein the semiconductor processing tool is configured to heat a die included within the die vessel to least 160 degrees Celsius, wherein the actuator comprises:
- a conveyor belt configured to move the die vessel between the internal procession port location and the external processing port location;
- a plurality of pulleys configured to rotate and cause movement of the conveyor belt; and
- a force sensor coupled to at least one of the pulleys and configured to determine an amount of force exerted by the at least one of the pulleys to move the die vessel container.

10. The system of claim 9, wherein the force sensor comprises at least one of: a force gauge, a force sensing resistor, a force sensing capacitor, or a spring compression sensor.

11. The system of claim 10, wherein the robot comprises a six axis transfer robotic arm having six degrees of freedom for movement.

12. The system of claim 9, wherein the die vessel is contained in the die vessel container and the robot is configured to remove the die vessel from the die vessel container when the die vessel container is located at the internal processing port location.

13. The system of claim 12, wherein the die vessel container is a slotted die vessel container.

14. The system of claim 12, wherein the die vessel container is a stackable die vessel container.

15. A method, comprising:
- moving a die vessel between an external processing port and an internal processing port using an actuator, wherein the die vessel comprises a plurality of receptacles, each of the plurality of receptacles configured to hold an unfinished die therein;
- when the die vessel is located at the internal processing port location, using a robot to move each of the unfinished dies from a respective receptacle to a port of a semiconductor processing tool, wherein the robot comprises a six axis transfer robotic arm having six degrees of freedom for movement,
- wherein the actuator comprises:
  - a conveyor belt configured to move the die vessel between the internal procession port location and the external processing port location; and
  - a plurality of pulleys configured to rotate and cause movement of the conveyor belt; and
  - a force sensor couple to at least one of the pulleys and configured to determine an amount of force exerted by the at least one of the pulleys to move the die vessel container.

16. The method of claim 15, further comprising:
- determining a force value exerted by the actuator in response to moving the die vessel; and
- ceasing movement of the die vessel in response to the force value passing a threshold value.

17. The method of claim 16, further comprising:
- removing the die vessel from the actuator in response to the force value passing the threshold value.

18. The method of claim 16, further comprising:
- moving the die vessel between the external processing port and an automated material handling system.

19. The method of claim 16, wherein
the force sensor comprises at least one of: a force gauge, a force sensing resistor, a force sensing capacitor, or a spring compression sensor.

20. The method of claim 16, further comprising:
- removing the die vessel from a die vessel container while on the internal processing port and in response to the force value not passing the threshold value.

* * * * *